US005113190A

United States Patent [19]

Klein

[11] Patent Number: 5,113,190

[45] Date of Patent: May 12, 1992

[54] DEVICE FOR REDUCING ELECTROMAGNETIC LEAKAGE RADIATION IN THE VICINITY OF RADIATION SYSTEMS

[75] Inventor: Albert Klein, Wetter, Fed. Rep. of Germany

[73] Assignee: Laboratorium Prof. Dr. Rudolf Berthold GmbH & Co., Wildbad, Fed. Rep. of Germany

[21] Appl. No.: 521,679

[22] Filed: May 10, 1990

[30] Foreign Application Priority Data

May 10, 1989 [DE] Fed. Rep. of Germany ....... 3915280

[51] Int. Cl.[5] .................... H01Q 17/00; G01B 15/00; G01R 27/26; H01P 1/22

[52] U.S. Cl. .......................................... 342/4; 324/640; 333/81 R; 343/911 R

[58] Field of Search ............... 343/703, 872, 873, 909, 343/911 R; 342/1, 2, 3, 4; 174/35 MS; 333/81 R; 324/639, 640

[56] References Cited

U.S. PATENT DOCUMENTS

| | | | |
|---|---|---|---|
| 2,870,439 | 1/1959 | Stinehelfer | 333/81 R |
| 3,568,196 | 3/1971 | Bayrd et al. | 342/4 |
| 3,623,099 | 11/1971 | Suetake | 342/4 |
| 4,164,718 | 8/1979 | Iwasaki | 342/4 |
| 4,381,510 | 4/1983 | Wren | 343/909 |
| 4,496,950 | 1/1985 | Hemming et al. | 342/4 |
| 4,620,146 | 10/1986 | Ishikawa et al. | 343/703 |

FOREIGN PATENT DOCUMENTS

| | | | |
|---|---|---|---|
| 1253780 | 11/1967 | Fed. Rep. of Germany | 342/4 |
| 2319731 | 10/1973 | Fed. Rep. of Germany | 343/872 |
| 3415610 | 10/1984 | Fed. Rep. of Germany | 343/703 |

OTHER PUBLICATIONS

H. G. Haddenhorst; Durchgang von elektromagnetischen Wellen durch inhomogene Schichten (Teil II: Absorption von elektromagnetischen Wellen) Von Hans-Gunther Haddenhorst; (Eingegangen am 15 Nov. 1955).

*Primary Examiner*—Michael C. Wimer
*Assistant Examiner*—Peter Toby Brown
*Attorney, Agent, or Firm*—Spensley Horn Jubas & Lubitz

[57] ABSTRACT

Absorber elements for reducing electromagnetic leakage radiation, in particular in the vicinity of horn antennas, are in the form of ribs with a roof- or wedge-shaped cross section arranged such that the angle enclosed by lateral surfaces of the absorber elements is less than 90°, so that at least the leakage radiation impinging in general parallel to the center plane of the absorber elements arrives at a large angle of incidence, i.e. glancingly. In particular, if the angle of incidence approximately corresponds to the Brewster angle, the result is an almost complete absorption of the corresponding polarization components of the leakage radiation. The absorption effect can be further optimized by proper selection of the configuration of the roof- or wedge-shaped absorber elements.

A preferred use of these absorber elements is in connection with transmission measurement for the determination of moisture, for example, employing opposed horn antennas between which a layer of material to be measured is passed. The absorber elements are then disposed in the vicinity of the receiving horn antenna, because of which they display satisfactory absorption effects. Because of their wedge-shaped design, the absorber elements remain free of dirt accumulation to a large degree, since material to be measured which might fall down cannot stick to the lateral surfaces of the absorber elements.

8 Claims, 4 Drawing Sheets

DEVICE FOR REDUCING ELECTROMAGNETIC LEAKAGE RADIATION IN THE VICINITY OF RADIATION SYSTEMS

FIELD OF THE INVENTION

The invention relates to a device for reducing electromagnetic leakage radiation in the vicinity of radiation systems, in particular of a horn antenna in the microwave range, which device is composed of absorbing elements at least part of the surface of which is not disposed orthogonally to the main beam direction of the transmitting and receiving system.

BACKGROUND OF THE INVENTION

A radiation system of the type here under consideration is Application DE-OS 34 15 610, and its counterpart U.S. Pat. No. 4,620,146 particular reference being made to FIG. 5. This publication deals With an arrangement for determining moisture in a track-like object which is guided through a radiation system composed of horn-shaped transmitting and receiving antennas. The absorption of microwave radiation is in this case a measurement of the moisture content of the track.

Such an arrangement can also be used if, for example, a conveyor transporting bulk material is employed, instead of the track.

In connection with such measurements, microwave radiation components naturally appear which are scattered and/or reflected by objects in the vicinity and which reach the receiver horn antenna and lead to a distortion of the measured results. In the known device, the housing for the arrangement or the surfaces responsible for the undesired reflections and leakage radiation are therefore covered with an absorption material which is intended to provide an appropriate damping of the microwave leakage radiation.

In connection with the technical problems of absorption of vibrations, it is basically known from an article by H.-G. Haddenhorst, entitled "Durchgang von elektromagnetischen Wellen durch inhomogene Schichten (Teil II: Absorption von elektromagnetischen Wellen)"[Penetration of Non-homogenous Layers by Electromagnetic Waves (Part II: Absorption of Electromagnetic Waves)]in Zeitschrift für angewandte Physik [Journal of Applied Physics], Vol. VIII, Issue 6-1956, pp. 264 to 267, that there are various possibilities which basically depend on various physical effects.

Use is made of a suitable "absorption material" which, for example, achieves a damping effect, although over a relatively broad band, by transforming the arriving wave energy into heat or similar mechanisms, but this is not particularly effective. This may be the reason why, in the known embodiment in accordance with FIG. 5 of U.S. Pat. No. 4,620,146 an outward inclination is shown in addition to the absorption layer 18. Obviously it was realized in this case that the absorption layer 18 does not suffice to eliminate interference radiation in a satisfactory way, so that an "outward reflection" of the undesirable radiation component is achieved by means of the inclined outer surfaces, as shown by the dashed arrows.

A basically different possibility of the absorption of radiation consists in providing a resonator or resonating circuit based on the specific character of the radiation. However, the physical principle of resonance absorption results in a narrow band which can only be usefully employed if the damping of radiation of a correspondingly narrow bandwidth is involved. Otherwise it is possible to try to "widen" the frequency characteristics by the suitable coupling of a plurality of resonance absorbers with adjoining resonance frequencies. However, this unavoidably results in increased manufacturing costs.

SUMMARY OF THE INVENTION

It is an object of the invention to provide absorption elements having an improved damping effect, which can be used in the vicinity of such microwave radiation systems with greater variety, in particular through adaptation to the spatial and structural situations of the radiation system in connection with the appropriate arrangement.

The above and other objects are attained in accordance with the invention, by a device for reducing electromagnetic leakage radiation in the vicinity of a transmitter or receiver antenna of a system for performing measurements of microwave transmissions through or absorptions in a medium, where the transmitter and receiver antennas are disposed opposite each other, the transmitter antenna is arranged to transmit in a main beam direction, and the medium to be measured is disposed therebetween, said device comprising a plurality of absorber elements each having at least one surface portion which is nonperpendicular to the main beam direction of the transmitting antenna, wherein: each absorber element is an elongate member having a longitudinal dimension and composed of two rib elements, each rib element having an outer lateral surface extending in the direction of the longitudinal dimension; the two lateral surfaces define a wedge, and enclose an angle $\alpha$ of less than 90°, in a direction perpendicular to the longitudinal dimension; and the value of angle $\alpha$ is selected such that the angle of incidence of radiation impinging on said lateral surfaces approximately corresponds to the Brewster angle, so that the corresponding polarization components of the impinging radiation are substantially completely absorbed.

In addition to an increase in the absorptive effects, this solution has the advantage that, with a vertical arrangement of the lateral surfaces of the absorber, practically no deposits or dirt can form or be retained.

It is understood that the choice of the material and the choice of the angle $\alpha$ enclosed by the lateral surfaces of the absorber has to be made within certain limits such that optimum adaptation to the radiation characteristics of the radiation system to be shielded is attained.

Such absorber elements can be placed individually with little effort either singly or in combination in the vicinity of the horn antennas which are particularly "endangered" by the leakage radiation and they are structurally very simple to handle.

An improvement in the damping effects is attained in particular by choosing the angle $\alpha$ enclosed by the lateral surfaces of the absorber elements is such a way that the angle of incidence of the leakage radiation approximately corresponds to the Brewster angle, so that the corresponding polarization component of the radiation is completely absorbed.

Because the absorber elements in connection with the above transmission measurement for determining moisture content have a defined orientation to the object to be measured (for example a conveyor belt with bulk materials), so that a large portion of the leakage radiation arrives essentially parallel to the center axis of the absorber elements, it is relatively easy to fulfill this requirement by a correspondingly "pointed" design of the absorber elements, in particular if, when using linearly polarized antennas such as, for example, rectangular horn antennas, the absorber elements are aligned in accordance with the plane of polarization of the radiation system. In this advantageous case, impinging polarized radiation can be absorbed practically completely by the absorber element.

In case of radiation which is either not radiated in the plane of polarization or in several planes of polarization, it is possible to obtain satisfactory absorption in that, for example, the fronts of the absorber elements also extend obliquely outwardly.

According to a further advantageous embodiment, the absorber elements forming a roof composed of two lateral plates are designed such that the thickness of the lateral plates increases with the distance from the peak; in particular they have a wedge-like cross section.

Because of this, the portion of the radiation transmitted by the absorber elements impinges at a larger angle of incidence on the second, rear boundary surface of the absorber and is more strongly reflected there.

The portion reflected back to the front boundary surface also impinges on the front boundary surface at a steeper angle of incidence and therefore with increased reflection.

If, in accordance with a further embodiment of this variant, the wedge angle, i.e. the angle $\delta$ enclosed between the outer and inner boundary surfaces, is selected so that total reflection occurs at the inner boundary surface if the angle of incidence at the outer boundary surface corresponds to the Brewster angle, it is attained that the repeatedly reflected portion of the radiation can leave the absorber element only at the lower front of the wedge-shaped lateral surfaces of the absorber element and therefore is damped to a larger degree than in the case of only a single irradiation of the absorber.

It is possible to achieve a considerable reduction of the wedge angle if a metallic layer is applied to the inner boundary surface, i.e. the inside of the lateral plates, and the wedge angle is then selected so that the radiation reflected by the inner boundary surface formed by the metallic layer is totally reflected at the outer boundary surface, if the angle of incidence at the outer boundary surface again corresponds to the Brewster angle.

In this case the requirement for total reflection does not need to be fulfilled at the rear boundary surface, and the angle of incidence for only that portion of the radiation which reaches the front boundary layer must be larger than the critical angle of the total reflection.

With the embodiments described, the wedge-shaped lateral surfaces of the absorber elements act, as it were, as "radiation conductors", which "divert" the radiation to be damped towards the lower front of the lateral surfaces.

Accordingly, in a further embodiment this "opening cross section" of the lateral plates is further damped by disposing there, with appropriate electrical adaptation, a strongly absorbing layer of material which, if required, may also be closed off at its underside by a further metal plate.

By means of this, it becomes possible to also use for the lateral plates of the absorber element, material showing no or only a small loss, which leads to considerable reduction of the manufacturing costs. In the latter case, if an additional "metal closure" is provided, the portion of the radiation arriving there is again reflected back to lateral surfaces of the absorber element, where a further portion of the radiation energy can be absorbed.

The inventive concept can be designed and adapted with great flexibility, for example, to devices for transmission measurement.

A plurality of exemplary embodiments will be described in detail with reference to the drawings.

DESCRIPTION OF THE PREFERRED EMBODIMENTS

Figure 1:
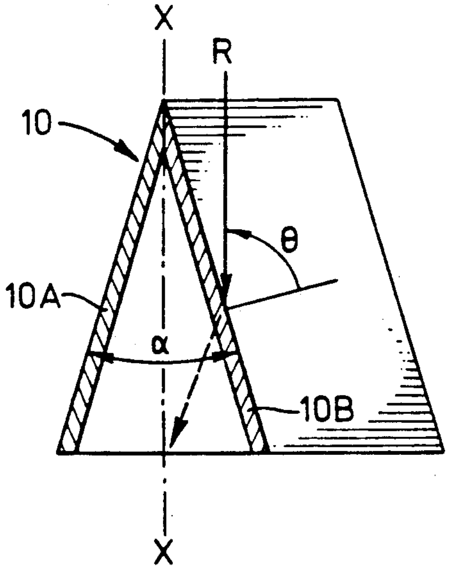
FIG. 1 is a perspective, elevational view of a first embodiment of an absorber element according to the invention.
Figure 3:
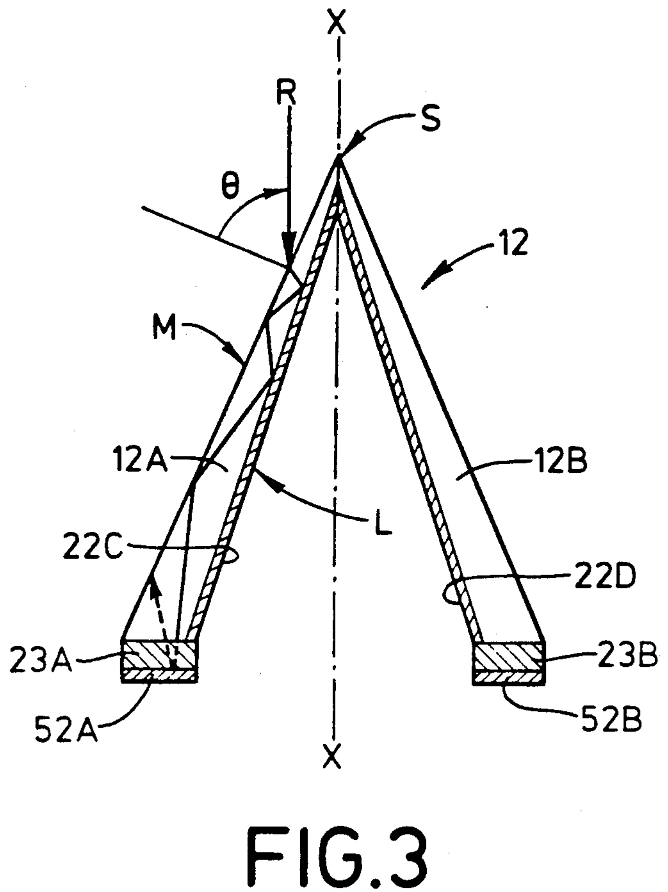

FIG. 1 is a perspective view of a first exemplary embodiment of an absorber element 10, which is formed in the shape of ribs with a roof-like cross section i.e., in the form of a wedge having a tip S as shown in FIG. 3. Two lateral plates 10A and 10B enclose an angle o between them. Leakage radiation R impinges on lateral plates 10A and 10B at an angle of incidence $\Theta$ and is absorbed there to a greater or lesser degree, depending on their plane of polarization and the value of the angle of incidence $\Theta$, as has been explained above. The material of the lateral plates 10A and 10B should have as great a radiation damping effect as possible.

Figure 2:
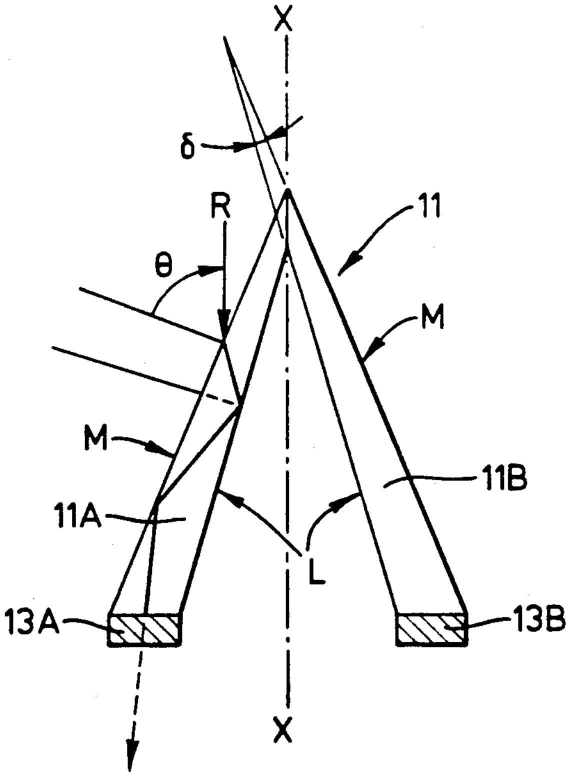
FIGS. 2 to 4 are elevational views showing three further exemplary embodiments of an absorber element according to the invention.
Figure 4:
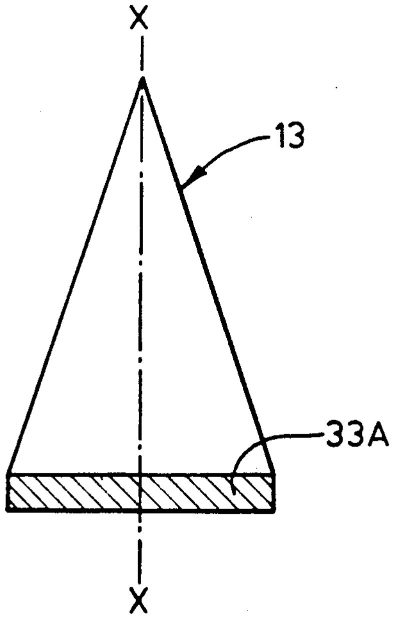

The exemplary embodiments illustrated in FIGS. 2 to 4 are only shown in sectional view, however, they also are ribshaped absorber elements as shown in FIG. 1.

In the exemplary embodiment of absorber element 11 shown in FIG. 2, the lateral plates 11A and 11B are wedge-shaped, i.e. the inner boundary surface L and outer boundary surface M of each plate forms a wedge angle $\delta$. As shown in FIG. 2, it is possible to achieve, with an appropriate selection of the angle of incidence $\Theta$ and the wedge angle $\delta$, that a radiation component R, impinging parallel to the axis X—X, is "captured" in the respective lateral plate, here plate 11A, if the appropriate reflection conditions are met. Therefore, such radiation components can leave the lateral plate only by its lower edge, which components are shown by a broken line. Accordingly, absorber members 13A, 13B are disposed at the lower edge of each plate to remove further radiation energy from the radiation portion which already has been strongly damped by their passage through the lateral plates 11A and 11B. In case members 13A, 13B produce a sufficiently strong absorption effect, it is possible, in connection with appropriate cases of application, to use less strongly absorbing material as the material for the lateral plates 11A, 11B.

Finally, the long path followed by the radiation in dependence on the correspondingly selected angle of incidence $\Theta$ and wedge angle $\delta$ result in very heavy damping.

In the exemplary embodiment of absorber element 12 shown in FIG. 3, the principle explained with reference to FIG. 2 has been extended in that the inner boundary surface L of each absorber member 12A and 12B is formed by a metallic layer 22C or 2D, respectively, so that at this inner boundary surface total reflection always occurs, regardless of the angle of incidence Θ.

According to a further variant, the lower absorber members 23A and 23B are covered at their bottom by a further metal layer 52A or 52B, respectively, so that the already damp radiation cannot leave the absorber element 12 at this place and is again reflected back into the lateral plates 12A, 12B, where further damping can take place.

The exemplary embodiment 13 shown in FIG. 4 represents a variant which is distinguished by its particularly structural simplicity. The two lateral plates are here brought together into a single wedge-shaped plate, as it were, which is closed off at the bottom by an absorber layer 33A, so that in this case, too, the repeatedly reflected portion of the leakage radiation is finally damped there before it can leave the absorber element 13.

It is to be understood that the four exemplary embodiments described are only of an exemplary nature. It is possible, in particular depending on the manner of use, to provide mixed forms or suitable combinations of these variants to optimize the absorption capability by adaptation to the particular leakage radiation and its polarization properties.

Figure 5:
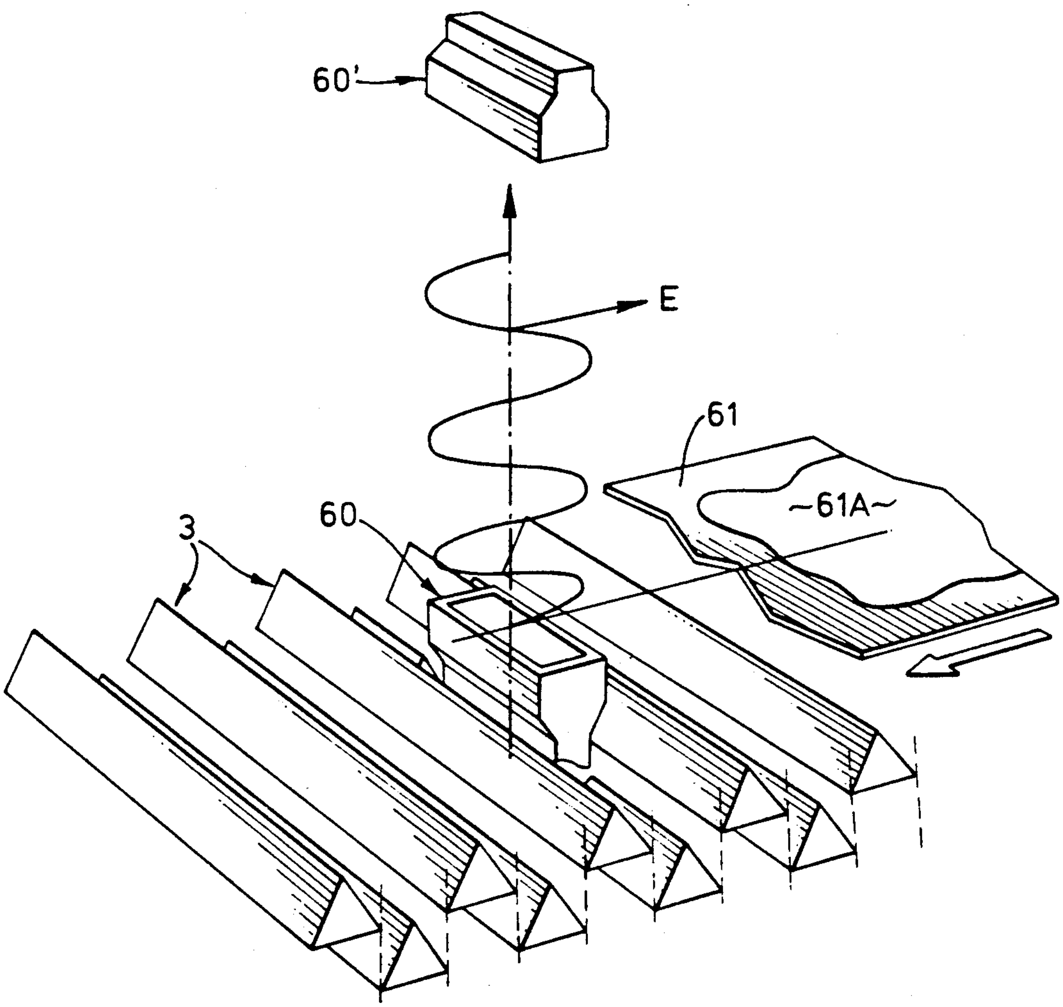
FIGS. 5 and 6 are perspective views showing two exemplary embodiments of a plurality of absorber elements in a device for transmission measurement.
Figure 6:
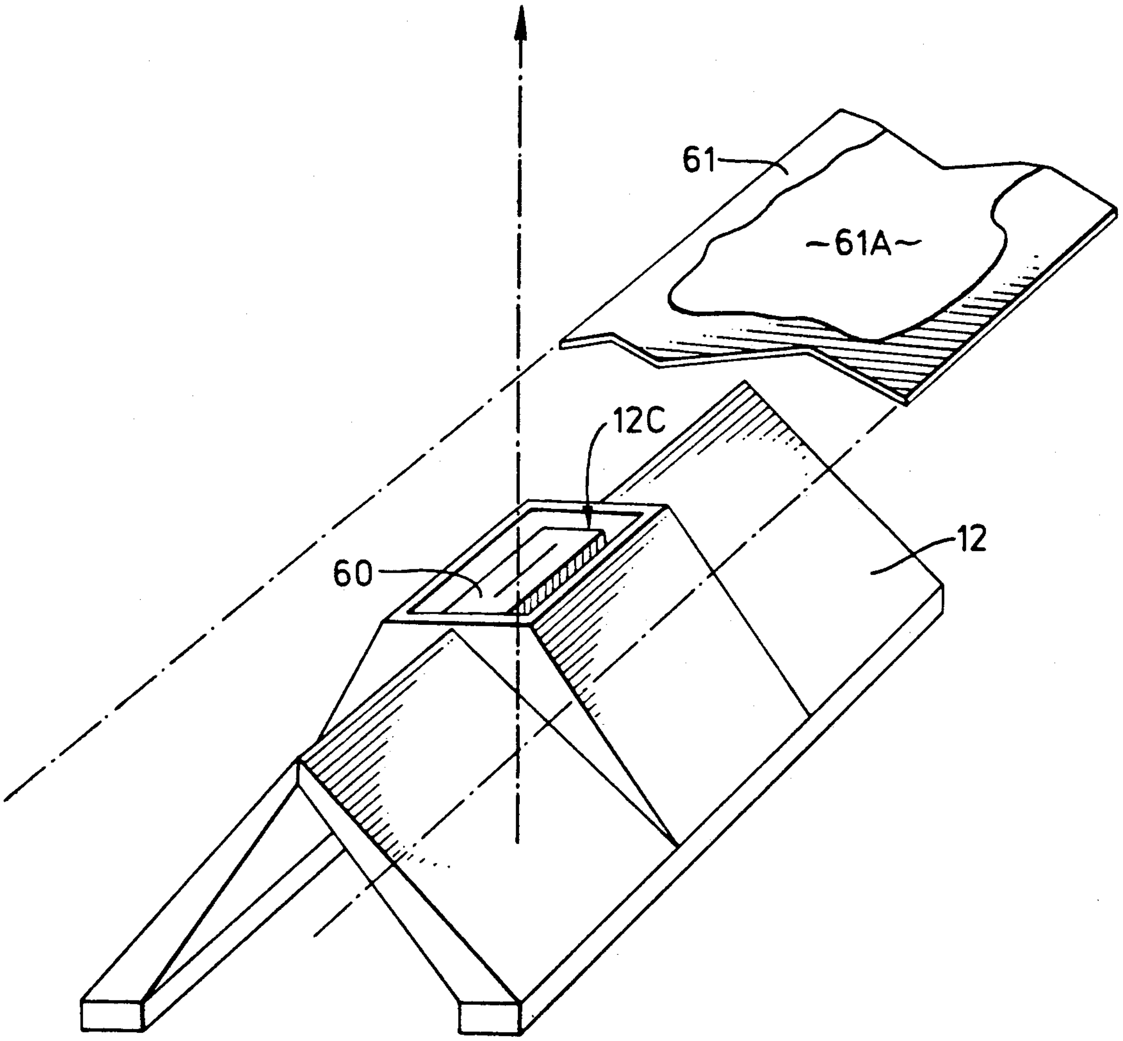

Two exemplary embodiments of devices using such absorber elements are shown in FIGS. 5 and 6. In this case the basis for a device for transmission measuring is the one known in principle from the above mentioned U.S. Pat. No. 4,690,146 so that a detailed description of this device is not required here.

In the first exemplary embodiment shown in FIG. 5, a plurality of absorber elements 13 in accordance with FIG. 4 are disposed in two planes parallel on both sides of a horn antenna 60 which faces a second antenna 60 in such a way that the projections of the absorber elements 13 on a plane perpendicular to the main radiation direction completely covers this plane. By means of this it is achieved that, on the one hand, optimum absorption effects are attained and, on the other, material to be measured, such as, for example, bulk materials 61A, which may fall off the passing material carrier 61, can fall between the arrangement of the absorber elements 13 and thus does not contribute to soiling and diminishment of the absorption effects.

The horn antenna 60 is aligned in such a way that the E-component of its electromagnetic radiation extends perpendicular to the mutually parallel longitudinal axes of the absorber elements 13, which has been indicated in FIG. 5 by the vector E of the electric field.

The arrangement of the absorber elements 13 is easily designed in the form of modules and can be placed next to the horn antenna in suitable frames or holders.

In the second exemplary embodiment shown in FIG. 6, an absorber element 12 is used which in general corresponds to the exemplary embodiment shown in FIGS. 2 or 3. The wedge-shaped design has been modified in the area of the horn antenna 60 in such a way that a recess 12C remains, into the area of which the horn antenna 60 is placed.

In both exemplary embodiments in accordance with FIG. 5 and FIG. 6, the feed direction of the material carrier 61 conveying material 61A to be measured has only been shown by way of example. The orientation of this carrier in relation to the absorber elements is not important.

It will be appreciated that the various components of absorber elements according to the invention can be made of any suitable, known radiation absorbing material.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A device for reducing electromagnetic leakage radiation in the vicinity of a transmitter or receiver antenna of a system for performing measurements of microwave transmissions through or absorptions in a medium, where the transmitter antenna is arranged to transmit in a main beam direction, and the medium to be measured is disposed therebetween, said device comprising a plurality of absorber elements each having at least one surface portion which is nonperpendicular to the main beam direction of the transmitting antenna, wherein: each said absorber element is an elongate member having a longitudinal dimension and composed of two rib elements, each rib element having an outer lateral surface extending in the direction of the longitudinal dimension; said two lateral surfaces define a wedge having a tip, and enclose an angle $\alpha$ of less than 90°, in a plane perpendicular to the longitudinal dimension; and the value of the angle $\alpha$ is selected such that the angle of incidence of radiation impinging on said lateral surfaces approximately corresponds to the Brewster angle, so that the corresponding polarization components of the impinging radiation are substantially completely absorbed, wherein each said rib element is a lateral plate having an inner surface opposed to said outer lateral surface, with the thickness of each plate increasing with the distance from the tip of the wedge so that a second angle is formed between said inner surface and said outer lateral surface of each said plate, said plates consist of a low-loss material and each said plate has an edge which is remote from the tip of the wedge and extends in the direction of the longitudinal dimension, and further comprising a radiation absorbing layer of material which is more highly radiation absorbent than is the material of said plates and which is disposed along said edge of each said plate.

2. A device as defined in claim 1 wherein the antenna in the vicinity of which said device reduces leakage radiation is a horn antenna.

3. A device as defined in claim 1 wherein the second angle formed between said inner surface and said outer lateral surface of each said plate is selected such that substantially total reflection of radiation occurs at said inner surface when the angle of incidence of radiation impinging on said outer lateral surface corresponds to the Brewster angle.

4. A device as defined in claim 1 further comprising a respective metallic layer on said inner surface of each said plate, and the second angle formed between said inner surface and said outer lateral surface of each said plate is selected such that radiation is totally reflected by said inner surface of each said plate.

5. A device as defined in claim 1 further comprising a metal plate disposed on each said radiation absorbing layer.

6. A device as defined in claim 1 wherein: the medium is contained in a layer of material; the receiver antenna has a radiation receiving plane; and said absorber elements are positioned behind the receiving plane and are oriented so that their longitudinal dimensions are parallel to one another and are substantially parallel to he layer of material.

7. A device as defined in claim 1 wherein said absorber elements are arranged in two groups, each group is disposed in a respective one of two parallel planes, and said elements are positioned relative to one another such that the projections of the outlines of al of said absorber elements on a reference plane normal to the direction between he transmitter antenna and the receiver antenna and contiguous with one another.

8. A device as defined in claim 1 wherein: the medium is disposed in a first plane; the receiver antenna has a radiation receiving plane; one said absorber element has a recess in which the receiver antenna is disposed so tat h receiving plane is located in he recess and portions of said one absorber element surround the receiver antenna; and said one absorber element is oriented to have its longitudinal dimension parallel to the first plane.

* * * * *